US012668725B2

(12) United States Patent
Ki et al.

(10) Patent No.: US 12,668,725 B2
(45) Date of Patent: Jun. 30, 2026

(54) ADHESIVE COMPOSITION AND DISPLAY APPARATUS INCLUDING THE SAME

(71) Applicant: Samsung Display Co., LTD., Yongin-si (KR)

(72) Inventors: Bookan Ki, Yongin-si (KR); Wonseok Kim, Yongin-si (KR); Hoyun Byun, Yongin-si (KR); Intae Son, Yongin-si (KR); Sebeen Lee, Yongin-si (KR); Jeongin Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 301 days.

(21) Appl. No.: 18/376,139

(22) Filed: Oct. 3, 2023

(65) Prior Publication Data

US 2024/0318050 A1     Sep. 26, 2024

(30) Foreign Application Priority Data

Mar. 24, 2023     (KR) ........................ 10-2023-0039283

(51) Int. Cl.
| | |
|---|---|
| *C09J 133/08* | (2006.01) |
| *B32B 7/12* | (2006.01) |
| *H05K 5/03* | (2006.01) |

(52) U.S. Cl.
CPC .............. *C09J 133/08* (2013.01); *B32B 7/12* (2013.01); *H05K 5/03* (2013.01); *B32B 2457/20* (2013.01); *C09J 2400/143* (2013.01)

(58) Field of Classification Search
CPC ...... C09J 133/08; C09J 2400/143; C09J 4/00; C09J 11/06; C09J 133/066; B32B 7/12; B32B 2457/20; H05K 5/03; C08F 220/20; C08F 2/50; C08F 220/06; C08F 220/1808; C08F 220/1811; G09F 9/30; G09F 9/301
See application file for complete search history.

(56) References Cited

U.S. PATENT DOCUMENTS

| | | | |
|---|---|---|---|
| 2013/0040123 A1* | 2/2013 | Cho | G02B 5/3033 526/260 |
| 2019/0086709 A1* | 3/2019 | Lee | G02F 1/13338 |

FOREIGN PATENT DOCUMENTS

| | | |
|---|---|---|
| JP | 2014092186 A | 5/2014 |
| JP | 2018172571 A | 11/2018 |
| JP | 6904926 B2 | 6/2021 |
| KR | 102229885 B1 | 3/2021 |
| KR | 102447151 B1 | 9/2022 |
| KR | 102447233 B1 | 9/2022 |
| KR | 1020220129682 A | 9/2022 |

OTHER PUBLICATIONS

Translation for Kuze et al (WO 2023/053797 A1) (Year: 2023).*

(Continued)

*Primary Examiner* — Nathan L Van Sell
(74) *Attorney, Agent, or Firm* — CANTOR COLBURN LLP

(57) ABSTRACT
An adhesive composition includes (meth) acrylate having a glass transition temperature of 40° C. or less, (meth)acrylate having an alicyclic group, cross-linkable (meth)acrylate, (meth)acrylate having a hydroxyl group, and reactive dilution monomer, wherein a cured product of the adhesive composition has an elastic modulus of about 50,000 Pa or greater at a temperature of 60° C.

16 Claims, 11 Drawing Sheets

(56)     References Cited

OTHER PUBLICATIONS

M. D. Gower, et al., "Acrylic Acid Level and Adhesive Performance
and Peel Master-Curves of Acrylic Pressure-Sensitive Adhesives",
Nov. 13, 2005; DOI: 10.1002/polb.20779; Published online in
Wiley InterScience (www.interscience.wiley.com); (16 pages).

* cited by examiner

FIG. 7

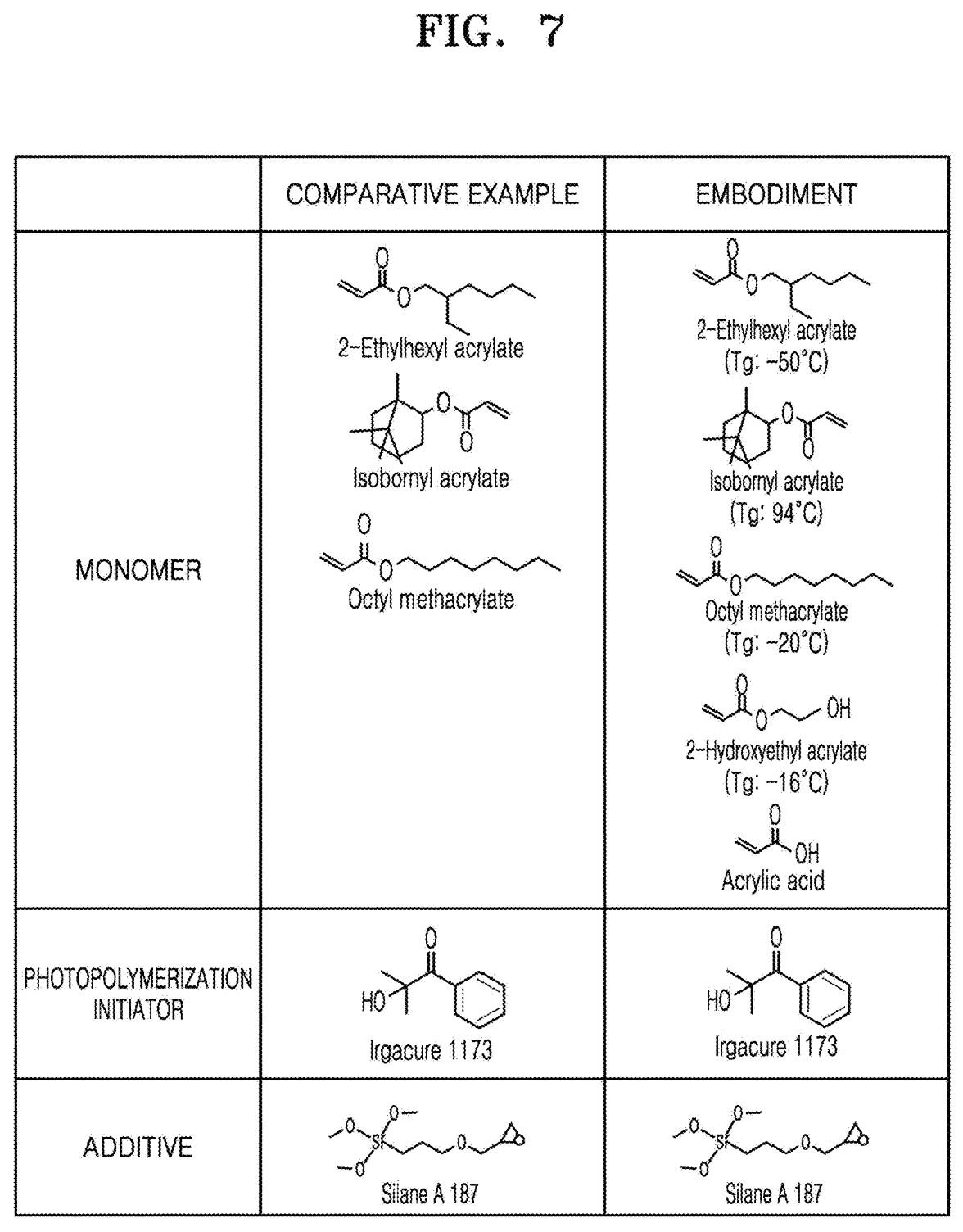

| | COMPARATIVE EXAMPLE | EMBODIMENT |
|---|---|---|
| MONOMER | 2-Ethylhexyl acrylate<br><br>Isobornyl acrylate<br><br>Octyl methacrylate | 2-Ethylhexyl acrylate (Tg: −50°C)<br><br>Isobornyl acrylate (Tg: 94°C)<br><br>Octyl methacrylate (Tg: −20°C)<br><br>2-Hydroxyethyl acrylate (Tg: −16°C)<br><br>Acrylic acid |
| PHOTOPOLYMERIZATION INITIATOR | Irgacure 1173 | Irgacure 1173 |
| ADDITIVE | Silane A 187 | Silane A 187 |

FIG. 8

| CHEMICAL COMPOSITION | | | EMBODIMENT | COMPARATIVE EXAMPLE |
|---|---|---|---|---|
| COMPONENTS (wt%) | MONOMER | 2-EHA | 36.4 | 46.45 |
| | | IBOA | 21.2 | 13.65 |
| | | OMA | 19.0 | 37.80 |
| | | 2-HEA | 16.1 | – |
| | | Acrylic acid | 5.2 | – |
| | ADDITIVE | Silane A 187 | 0.1 | 0.1 |
| | PHOTOPOLYMERIZATION INITIATOR | Irg 1173 | 2.0 | 2.0 |

FIG. 9

| | PENETRATED BUBBLES | | | |
|---|---|---|---|---|
| | NUMBER OF BUBBLES | SIZE (μm) | PENETRATION DISTANCE (μm) | SHAPE |
| EMBODIMENT | 0/30 | – | – | – |
| COMPARATIVE EXAMPLE | 3/30 | 110 | 310 | |

| | BUBBLES UNDER BM |
|---|---|
| EMBODIMENT | |
| COMPARATIVE EXAMPLE | |

FIG.  11

| | ELASTIC MODULUS (G') | | Max Stress(Pa) [Strain 25% @70℃] | GEL FRACTION (%) (0J) |
|---|---|---|---|---|
| | 25℃ (KPa) | 60℃ (KPa) | | |
| EMBODIMENT | 170 | 87 | 8,650 | 72 |
| COMPARATIVE EXAMPLE | 160 | 46 | 14,138 | 52 |

ADHESIVE COMPOSITION AND DISPLAY APPARATUS INCLUDING THE SAME

This application claims priority to Korean Patent Application No. 10-2023-0039283, filed on Mar. 24, 2023, and all the benefits accruing therefrom under 35 U.S.C. § 119, the content of which in its entirety is herein incorporated by reference.

BACKGROUND

1. Field

One or more embodiments relate to an adhesive composition and a display apparatus including the adhesive composition, and more particularly, to an adhesive composition with improved reliability against penetrated bubbles and a display apparatus including the adhesive composition.

2. Description of the Related Art

Recently, display apparatuses have been used for various purposes. Also, as display apparatuses have become thinner and more lightweight, the display apparatuses are more widely used in various fields. As the range of use of display apparatuses has been diversified, various methods have been researched to design the shape of display apparatuses.

In a display apparatus, a cover window for protecting lower structures is typically located over a display panel and an optically clear adhesive may be used to bond the display panel and the cover window together. The optically clear adhesive may be desired to have high moisture resistance, high heat resistance, and high adhesion together with high optical properties.

SUMMARY

One or more embodiments include an adhesive composition and a display apparatus having improved reliability against penetrated bubbles. However, this objective is merely an example, and the scope of the disclosure is not limited thereto.

According to one or more embodiments, an adhesive composition includes (meth) acrylate having a glass transition temperature of 40° C. or less, (meth)acrylate having an alicyclic group, cross-linkable (meth)acrylate, (meth)acrylate having a hydroxyl group, and reactive dilution monomer, where a cured product of the adhesive composition has an elastic modulus of about 50,000 pascals (Pa) or greater at a temperature of 60° C.

In an embodiment, the (meth)acrylate having the glass transition temperature of 40° C. or less may be included at a content of about 35 weight percent (wt %) to about 45 wt %.

In an embodiment, the (meth)acrylate having the alicyclic group may be included at a content in a range of about 15 wt % to about 25 wt %.

In an embodiment, the cross-linkable (meth)acrylate may be included at a content in a range of about 15 wt % to about 25 wt %.

In an embodiment, the (meth)acrylate having the hydroxyl group may be included at a content in a range of 10 wt % to 20 wt %.

In an embodiment, the reactive dilution monomer may be included at a content in a range of about 3 wt % to about 10 wt %.

In an embodiment, the (meth)acrylate having the hydroxyl group may include 2-hydroxyethyl (meth)acrylate.

In an embodiment, the reactive dilution monomer may include (meth)acrylic acid.

In an embodiment, the adhesive composition may further include a photopolymerization initiator, and the photopolymerization initiator may include 2-hydroxy-2-methyl-1-phenyl-propan-1-one.

In an embodiment, a maximum value of time-varying stress of the cured product of the adhesive composition may be about 10,000 Pa or less when a strain of 25% is applied thereto at a temperature of 70° C.

According to one or more embodiments, a display apparatus includes a display panel, a cover window disposed over the display panel, and an adhesive layer arranged between the display panel and the cover window, wherein the adhesive layer includes a cured product of an adhesive composition including (meth) acrylate having a glass transition temperature of 40° C. or less, (meth)acrylate having an alicyclic group, cross-linkable (meth)acrylate, (meth)acrylate having a hydroxyl group, and reactive dilution monomer, wherein the adhesive layer has an elastic modulus of about 50,000 Pa or greater at a temperature of 60° C.

In an embodiment, the display apparatus may include a bending area that is at least partially bent, and the display panel and the cover window corresponding to the bending area may be bent.

In an embodiment, the (meth)acrylate having the glass transition temperature of 40° C. or less may be included at a content in a range of about 35 wt % to about 45 wt %.

In an embodiment, the (meth)acrylate having the alicyclic group may be included at a content of about 15 wt % to about 25 wt %.

In an embodiment, the cross-linkable (meth)acrylate may be included at a content of about 15 wt % to about 25 wt %.

In an embodiment, the (meth)acrylate having the hydroxyl group may be included at a content of 10 wt % to 20 wt %.

In an embodiment, the reactive dilution monomer may be included at a content of about 3 wt % to about 10 wt %.

In an embodiment, the (meth)acrylate having the hydroxyl group may include 2-hydroxyethyl (meth)acrylate.

In an embodiment, the adhesive composition may further include a photopolymerization initiator, and the photopolymerization initiator may include 2-hydroxy-2-methyl-1-phenyl-propan-1-one.

In an embodiment, a maximum value of time-varying stress of the adhesive layer may be about 10,000 Pa or less when a strain of 25% is applied thereto at a temperature of 70° C.

BRIEF DESCRIPTION OF THE DRAWINGS

The above and other features of certain embodiments of the disclosure will be more apparent from the following description taken in conjunction with the accompanying drawings, in which:

FIG. 7 is a table showing the comparison between components of adhesive compositions according to an embodiment and a comparative example;

FIG. 8 is a table showing the comparison between particular component ratios of adhesive compositions according to an embodiment and a comparative example;

FIG. 9 is a table illustrating the penetrated bubble analysis test results of adhesive compositions according to an embodiment and a comparative example of the disclosure;

FIG. 11 is a table showing the measurements of physical properties of adhesive layers including adhesive compositions according to an embodiment and a comparative example.

DETAILED DESCRIPTION

Figure 1:
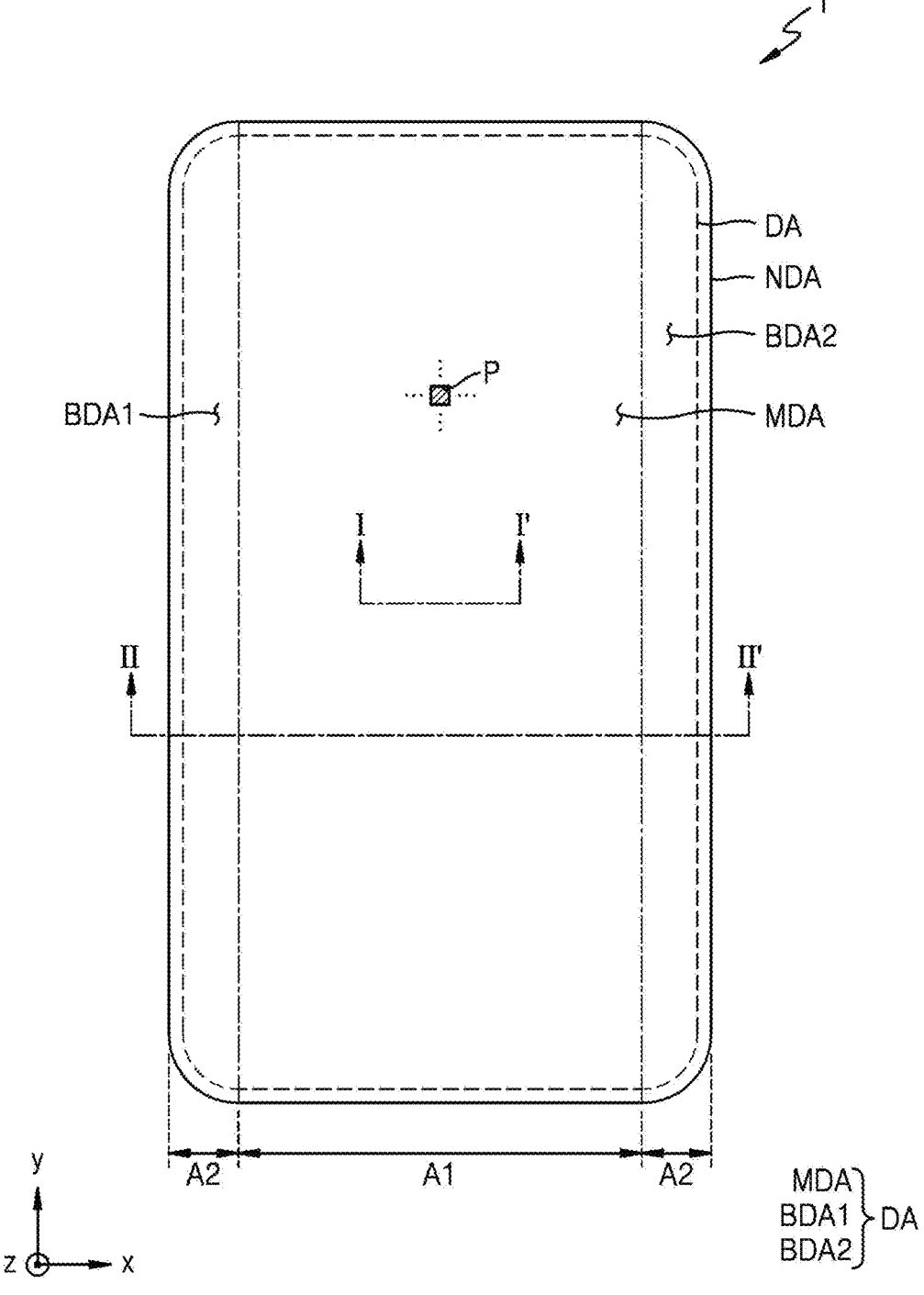
FIGS. 1 and 2 are plan views schematically illustrating an electronic apparatus including a display apparatus according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

The disclosure may include various embodiments and modifications, and certain embodiments thereof are illustrated in the drawings and will be described herein in detail. The effects and features of the disclosure and the accomplishing methods thereof will become apparent from the embodiments described below in detail with reference to the accompanying drawings. However, the disclosure is not limited to the embodiments described below and may be embodied in various modes.

It will be understood that although terms such as "first" and "second" may be used herein to describe various elements, these elements should not be limited by these terms and these terms are only used to distinguish one element from another element.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or.". As used herein, the term "and/or" includes any and all combinations of one or more of the associated listed items. Throughout the disclosure, the expression "at least one of a, b or c" or ""at least one selected from a, b and c" indicates only a, only b, only c, both a and b, both a and c, both b and c, all of a, b, and c, or variations thereof It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that when a layer, region, area, component, or element is referred to as being "on" another layer, region, area, component, or element, it may be "directly on" the other layer, region, area, component, or element or may be "indirectly on" the other layer, region, area, component, or element with one or more intervening layers, regions, areas, components, or elements therebetween.

In the following embodiments, the meaning of a line "extending in a first direction or a second direction" may include not only extending in a linear shape but also extending in a zigzag or curved shape in the first direction or the second direction.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

In the following embodiments, when referred to as "in a plan view," it may mean that a target portion is viewed from above, and when referred to as "in a cross-sectional view," it may mean that a cross-section of a target portion vertically cut is viewed from side. In the following embodiments, when referred to as "overlapping," it may include overlapping "in a plan view" and overlapping "in a cross-sectional view."

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within +30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments will be described in detail with reference to the accompanying drawings, and in the following description, like reference numerals will denote like elements.

Figure 2:
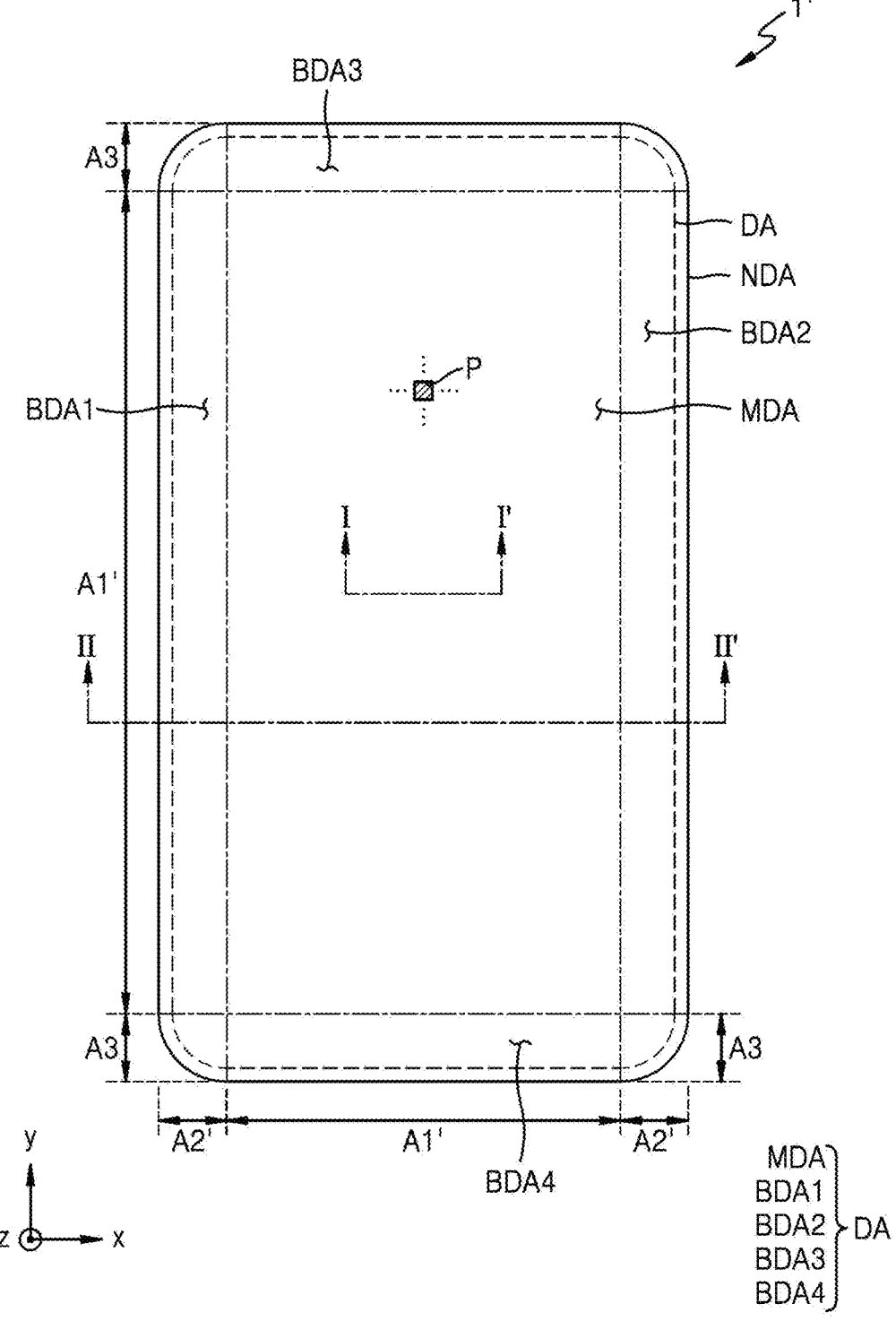

FIGS. 1 and 2 are plan views schematically illustrating an electronic apparatus including a display apparatus according to an embodiment.

An embodiment of a display apparatus 1 or 1' described below with reference to the drawings may be an apparatus that displays a moving image or a still image and may be used as a display screen of various products such as televisions, notebook computers, monitors, and billboards as well as portable electronic apparatuses such as mobile phones, smart phones, tablet personal computers (PCs), mobile communication terminals, electronic notebooks, electronic books, portable multimedia players (PMPs), navigation, or ultra-mobile PCs (UMPCs). Also, the display apparatus according to an embodiment may be used in wearable devices such as smart watches, watch phones, glasses-type displays, or head-mounted displays (HMDs). Also, the display apparatus according to an embodiment may be used as a center information display (CID) arranged at a vehicle's instrument panel or a vehicle's center fascia or dashboard, a room mirror display replacing a vehicle's side mirror, or a display arranged at a rear side of a vehicle's front seat as an entertainment for a vehicle's rear seat.

Referring to FIGS. 1 and 2, the display apparatus 1 or 1' may include a display area DA and a non-display area NDA outside the display area DA. A plurality of pixels P including display elements may be arranged in the display area DA, and the display apparatus 1 or 1' may provide an image by using the light emitted from the plurality of pixels P arranged in the display area DA. The non-display area NDA may be an area in which no display elements are arranged, and the display area DA may be entirely surrounded by the non-display area NDA.

FIGS. 1 and 2 illustrate a case where the display area DA of the display apparatus 1 or 1' has a rectangular shape with rounded corners; however, the disclosure is not limited thereto. In other embodiments, the display area DA may have a circular shape, an elliptical shape, or a polygonal shape such as a triangular shape or a pentagonal shape.

Hereinafter, embodiments where the display apparatus 1 or 1' is an organic light emitting display apparatus will be described as an example; however, the display apparatus of the disclosure is not limited thereto. In alternative embodiments, the display apparatus 1 or 1' of the disclosure may be an inorganic light emitting display apparatus (or an inorganic electroluminescence (EL) display apparatus) or may be a display apparatus such as a quantum dot light emitting display apparatus. In an embodiment, for example, an emission layer of a display element included in the display apparatus 1 may include an organic material, an inorganic material, quantum dots, an organic material and quantum dots, or an inorganic material and quantum dots.

FIGS. 1 and 2 illustrate an embodiment of the display apparatus 1 or 1' having a flat shape before bending; however, such an embodiment of the display apparatus 1 or 1' may include a three-dimensional display surface or a curved display surface. In an embodiment where the display apparatus 1 includes a three-dimensional display surface, the display apparatus 1 or 1' may include a plurality of display areas in different directions and may include, for example, a polygonal columnar display surface. In an embodiment, where the display apparatus 1 or 1' includes a curved display surface, the display apparatus 1 may be implemented in various forms such as flexible, foldable, and rollable display apparatuses.

The display apparatus 1 of FIG. 1 may include a first area A1 and a second area A2 arranged on opposing sides of the first area A1. The first area A1 may be, for example, a non-bending area, and the second area A2 may be a bending area capable of being bent with a preset curvature. In an embodiment where the display apparatus 1 has a bending area, each of the layers constituting the display apparatus 1 may be considered as having a bending area as described below with reference to FIG. 3.

In an embodiment, the display area DA may include a main display area MDA corresponding to the first area A1 and a first bending display area BDA1 and a second bending display area BDA2 corresponding to the second area A2.

In an embodiment, as shown in FIG. 2, the display apparatus 1' may include a first area A1' and a second area A2' and a third area A3 arranged on four edge sides around the first area A1'. The first area A1 may be, for example, a non-bending area, and the second area A2' and the third area A3 may be a bending area capable of being bent with a preset curvature. In such an embodiment, the second area A2' may be arranged on the left side (e.g., –x direction) and the right side (e.g., x direction) with the first area A1' arranged therebetween and may be bent around a bending axis in the long-axis direction (e.g., y direction), and the third area A3 may be arranged on the upper side (e.g., y direction) and the lower side (e.g., –y direction) with the first area A1' therebetween and may be bent around a bending axis in the short-axis direction (e.g., x direction). Accordingly, in such an embodiment, the display apparatus 1' may have a four-side bending structure.

In an embodiment, the display area DA may include a main display area MDA corresponding to the first area A1', a first bending display area BDA1 and a second bending display area BDA2 corresponding to the second area A2', and a third bending display area BDA3 and a fourth bending display area BDA4 corresponding to the third area A3. The first to fourth bending display areas BDA1 to BDA4 may be bent in different directions from each other.

Figure 3:
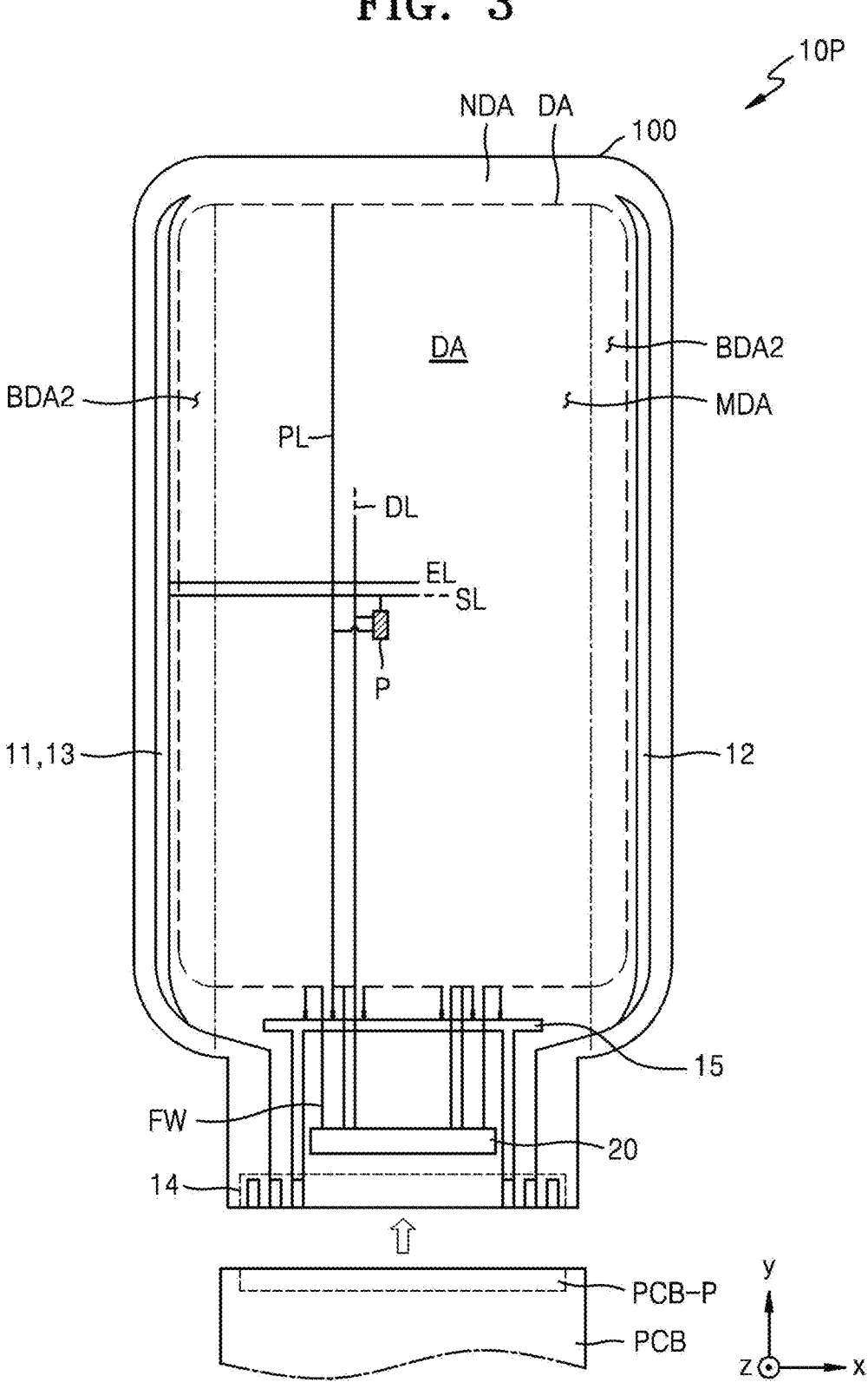
FIG. 3 is a plan view schematically illustrating a display panel according to an embodiment.
Figure 4:
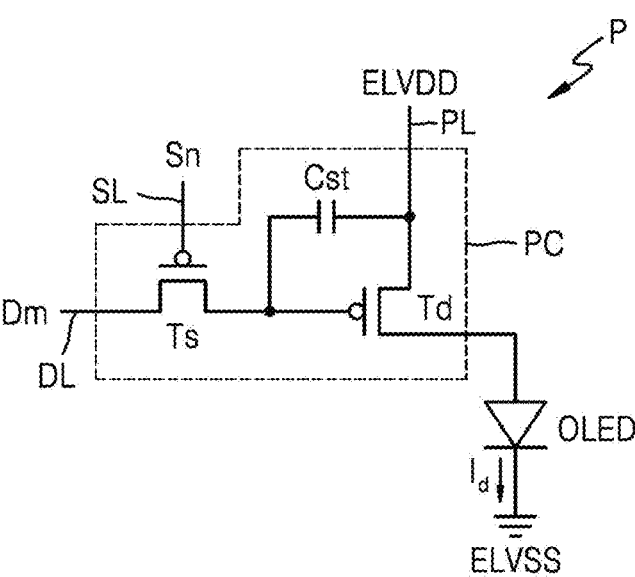
FIG. 4 is an equivalent circuit diagram of a pixel included in a display apparatus according to an embodiment.

FIG. 3 is a plan view schematically illustrating a display panel 10P according to an embodiment, and FIG. 4 is an equivalent circuit diagram of a pixel P according to an embodiment.

Referring to FIG. 3, an embodiment of the display panel 10P may include a substrate 100, and various components included in the display panel 10P may be disposed over the substrate 100.

A display area DA may include a main display area MDA that is a non-bending area, and first and second bending display areas BDA1 and BDA2 that are bending areas contacting the non-bending area. The first and second bending display areas BDA1 and BDA2 may be arranged on opposing sides of the main display area MDA located therebetween at a middle of the display area DA. That is, the first and second bending display areas BDA1 and BDA2 may be arranged adjacent to first and second scan driving circuits 11 and 12.

A plurality of pixels P may be disposed over the display area DA. The plurality of pixels P may include at least one subpixel and may be implemented by a display element such as an organic light emitting diode (OLED). The plurality of pixels P may emit, for example, red, green, blue, or white light.

The plurality of pixels P arranged in the display area DA may be electrically connected to outer circuits arranged in a non-display area NDA. A first scan driving circuit 11, a second scan driving circuit 12, an emission control driving circuit 13, a terminal 14, and a first power supply line 15 may be arranged in the non-display area NDA. A second power supply line (not illustrated) may be arranged outside the driving circuits 11, 12, and 13.

The first scan driving circuit 11 may provide a scan signal to the plurality of pixels P through a scan line SL. The second scan driving circuit 12 may be arranged in parallel to the first scan driving circuit 11 with the display area DA therebetween. Some of the plurality of pixels P arranged in the display area DA may be electrically connected to the first scan driving circuit 11, and the others thereof may be connected to the second scan driving circuit 12. In an alternative embodiment, the second scan driving circuit 12 may be omitted.

The emission control driving circuit 13 may be arranged on the side of the first scan driving circuit 11 and may provide an emission control signal to the pixel P through an emission control line EL. FIG. 3 illustrates an embodiment where the emission control driving circuit 13 is arranged only on one side of the display area DA; however, in an alternative embodiment, the emission control driving circuit 13 may be arranged on opposing sides of the display area DA like the first and second scan driving circuits 11 and 12.

The terminal 14 may be arranged in the non-display area NDA of the substrate 100. The terminal 14 may be exposed, by not being covered by an insulating layer, and be electrically connected to a printed circuit board PCB. A terminal PCB-P of the printed circuit board PCB may be electrically connected to a terminal 14 of the display panel 10P.

The printed circuit board PCB may be configured to transmit power or signals of a controller (not illustrated) to the display panel 10P. A control signal generated by the controller may be transmitted to each of the driving circuits 11, 12, and 13 through the printed circuit board PCB. Also, the controller may provide a driving voltage ELVDD to the first power supply line 15 and may provide a common voltage ELVSS to the second power supply line. The driving voltage ELVDD may be provided to the pixel P through a driving voltage line PL connected to the first power supply line 15, and the common voltage ELVSS may be provided to an opposite electrode of the pixel connected to the second power supply line. The first power supply line 15 may extend from the lower side of a second area A2 in one direction (e.g., x direction). The second power supply line may have a loop shape with one side open and may be disposed over the non-display area NDA.

Also, the controller may generate a data signal, and the generated data signal may be transmitted to an input line FW through a data pad unit 20 and transmitted to the pixel P through a data line DL connected to the input line FW.

Referring to FIG. 4, each pixel P may include a pixel circuit PC connected to a scan line SL and a data line DL and an organic light emitting diode OLED connected to the pixel circuit PC.

The pixel circuit PC may include a driving thin film transistor Td, a switching thin film transistor Ts, and a storage capacitor Cst. The switching thin film transistor Ts may be connected to the scan line SL and the data line DL and may be configured to transmit a data signal Dm input thereto through the data line DL to the driving thin film transistor Td in response to a scan signal Sn input thereto through the scan line SL.

The storage capacitor Cst may be connected to the switching thin film transistor Ts and the driving voltage line PL and may store a voltage corresponding to the difference between a voltage received from the switching thin film transistor Ts and a driving voltage ELVDD supplied to the driving voltage line PL.

The driving thin film transistor Td may be connected to the driving voltage line PL and the storage capacitor Cst and may control a driving current $I_d$ flowing from the driving voltage line PL through the organic light emitting diode OLED in response to a voltage value stored in the storage capacitor Cst. The organic light emitting diode OLED may emit light with a certain brightness corresponding to the driving current $I_d$.

FIG. 4 illustrates an embodiment where the pixel circuit PC includes two thin film transistors and one storage capacitor; however, the disclosure is not limited thereto. In an alternative embodiment, the pixel circuit PC may include seven thin film transistors and one storage capacitor. In other alternative embodiments, the pixel circuit PC may include two or more storage capacitors.

Figure 5:
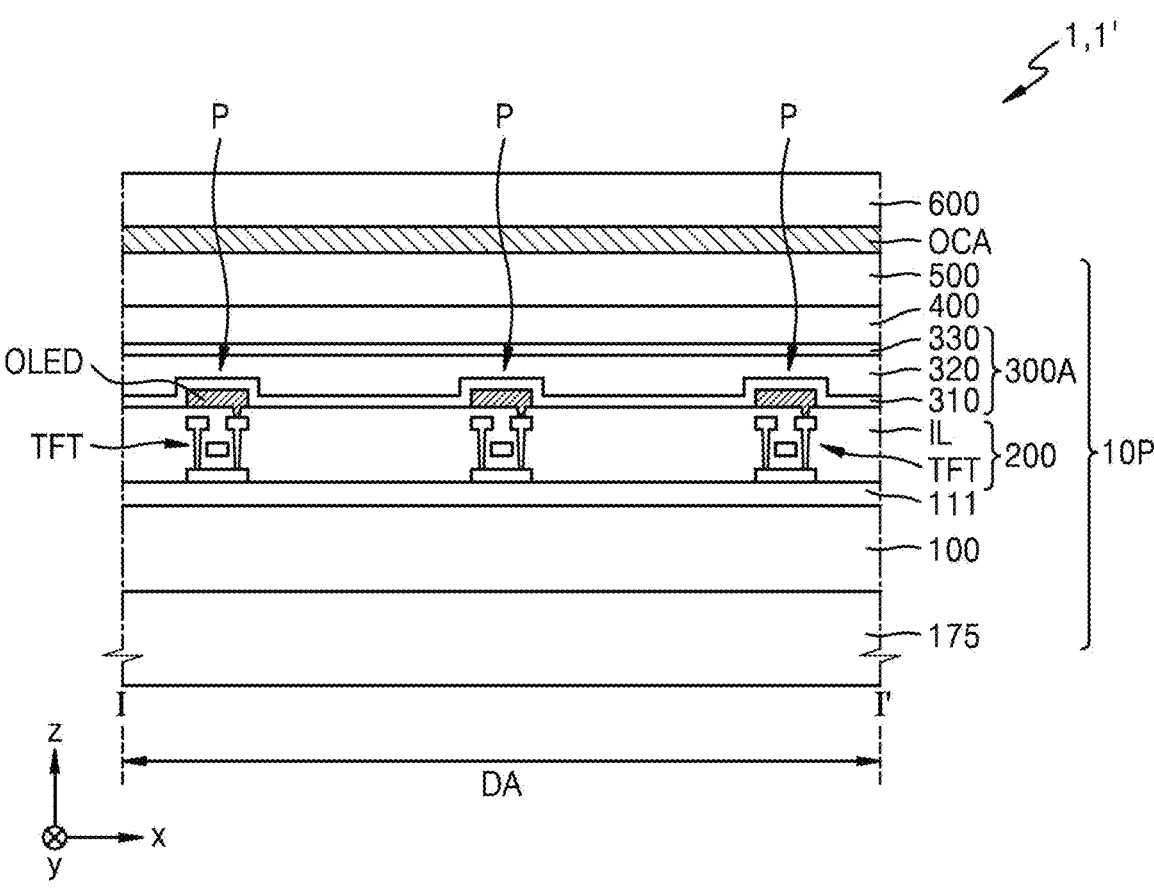
FIG. 5 is a cross-sectional view schematically illustrating a stack structure of a display apparatus according to an embodiment.
Figure 6:
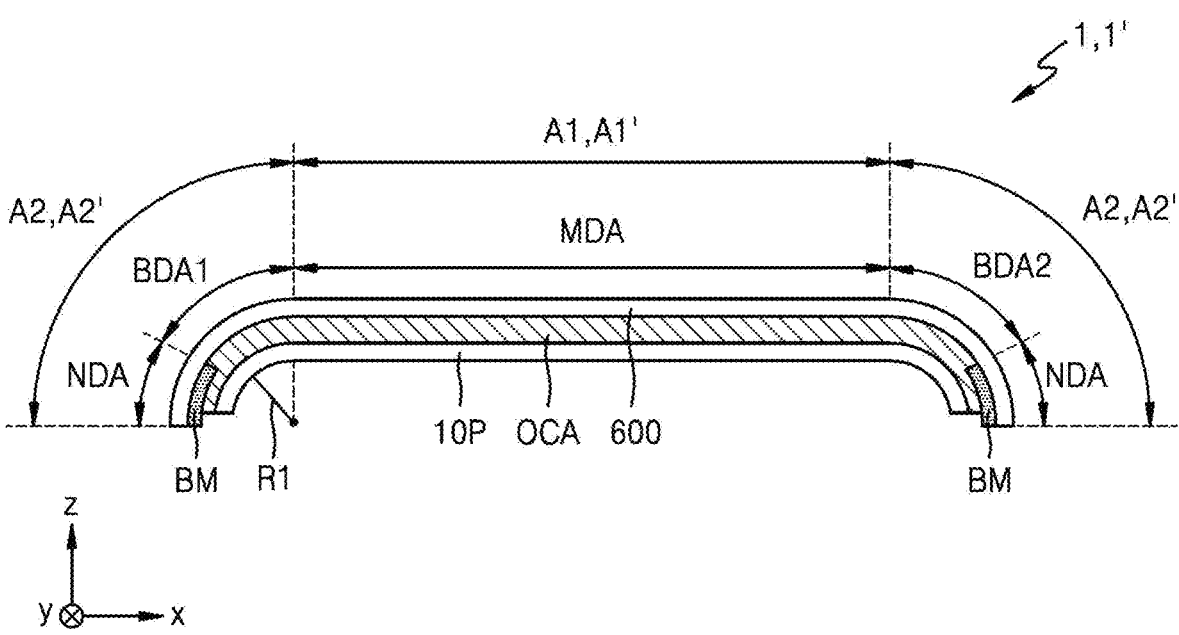
FIG. 6 is a cross-sectional view schematically illustrating a display apparatus according to an embodiment.

FIG. 5 is a cross-sectional view schematically illustrating a stack structure of a display apparatus 1 or 1' according to an embodiment, and FIG. 6 is a cross-sectional view schematically illustrating a display apparatus 1 or 1' according to an embodiment. FIG. 5 may correspond to a cross-section of the display apparatus 1 or 1' of FIG. 1 or 2 taken along line I-I'.

Referring to FIG. 5, an embodiment of the display panel 10P may include a substrate 100, a display layer 200 disposed over the substrate 100, a thin film encapsulation layer 300A over the display layer 200, an input sensing layer 400, and an anti-reflection layer 500. The display panel 10P may include a plurality of display elements for displaying an image. The display elements may be included in the display layer 200.

The substrate 100 may include glass or polymer resin. In an embodiment, for example, the polymer resin of the substrate 100 may include polyether sulfone, polyacrylate, polyether imide, polyethylene naphthalate, polyethylene terephthalate, polyphenylene sulfide, polyarylate, polyimide, polycarbonate, or cellulose acetate propionate. The substrate 100 including the polymer resin may be flexible, rollable, or bendable. The substrate 100 may have a multi-layer structure including an inorganic layer (not illustrated) and a layer including the polymer resin.

In an embodiment of the display panel 10P, a buffer layer 111 may be further provided over the substrate 100. The buffer layer 111 may reduce or block the penetration of foreign materials, moisture, or external air from under the substrate 100 and may provide a flat surface over the substrate 100. The buffer layer 111 may include an inorganic insulating material such as silicon oxide, silicon oxynitride, or silicon nitride and may be formed in (or defined by) a single-layer or multiple-layer structure including at least one selected from the above materials.

The display layer 200 may be arranged on the front surface (e.g., z-direction surface) of the substrate 100. In an embodiment of the display apparatus 1 or 1', a lower protection film 175 may be further arranged on the rear surface of the substrate 100. The lower protection film 175 may support and protect the substrate 100. The lower protection film 175 may include an organic insulating material such as polyethylene terephthalate or polyimide. The lower protection film 175 may be attached to the rear surface of the substrate 100. An adhesive layer may be arranged between the lower protection film 175 and the substrate 100. Alternatively, the lower protection film 175 may be directly formed on the rear surface (e.g., −z-direction surface) of the substrate 100, and in this case, an adhesive layer may not be arranged between the lower protection film 175 and the substrate 100.

The display layer 200 may include a plurality of pixels. The display layer 200 may include a display element layer including an organic light emitting diode OLED as a display element, a circuit layer including a thin film transistor TFT electrically connected to the organic light emitting diode OLED, and an insulating layer IL. The organic light emitting diode OLED may be electrically connected to the thin film transistor TFT to form a pixel P.

The display layer 200 may be sealed with an encapsulation member. In an embodiment, the encapsulation member may include a thin film encapsulation layer 300A as illustrated in FIG. 5. The thin film encapsulation layer 300A may include at least one inorganic encapsulation layer and at least one organic encapsulation layer. In an embodiment, the thin film encapsulation layer 300A may include first and second inorganic encapsulation layers 310 and 330 and an organic encapsulation layer 320 therebetween.

In an alternative embodiment, the encapsulation member may include an encapsulation substrate. The encapsulation substrate may be arranged to face the substrate 100 with the display layer 200 therebetween. A gap may be between the encapsulation substrate and the display layer 200. The encapsulation substrate may include glass. A sealant may be arranged between the substrate 100 and the encapsulation substrate, and the sealant may be arranged in the non-display area NDA described above with reference to FIG. 1 or 2. The sealant arranged in the non-display area NDA may surround the display area DA to prevent moisture from penetrating through the side surface thereof.

The input sensing layer 400 may be configured to obtain coordinate information according to an external input, for example, a touch event of an object such as a finger or a stylus pen. The input sensing layer 400 may include a touch electrode and trace lines connected to the touch electrode. The input sensing layer 400 may be configured to sense an external input by a mutual cap method or a self cap method.

The input sensing layer 400 may be formed over (or directly formed on) the encapsulation member. Alternatively, the input sensing layer 400 may be separately formed and then coupled on the encapsulation member through an adhesive layer such as an optically clear adhesive. In an embodiment, the input sensing layer 400 may be directly formed over the thin film encapsulation layer 300A or the encapsulation substrate, and in this case, an adhesive layer may not be arranged between the input sensing layer 400 and the thin film encapsulation layer 300A or the encapsulation substrate.

The anti-reflection layer 500 may be configured to reduce the reflectance of light (external light) incident from the outside toward the display panel 10P.

In an embodiment, the anti-reflection layer 500 may include an optical plate including a phase retarder and/or a polarizer. The phase retarder may be a film type or a liquid crystal coating type and may include a λ/2 phase retarder and/or a λ/4 phase retarder. The polarizer may also be a film type or a liquid crystal coating type. The film-type polarizer may include a stretchable synthetic resin film, and the liquid crystal coating-type polarizer may include liquid crystals arranged in a certain arrangement.

In an embodiment, the anti-reflection layer 500 may include a filter plate including a black matrix and color filters. The filter plate may include color filters arranged for each pixel, a black matrix, and an overcoat layer.

In an embodiment, the anti-reflection layer 500 may include a destructive interference structure. The destructive interference structure may include a first reflection layer and a second reflection layer arranged in different layers, respectively. First reflected light and second reflected light respectively reflected by the first reflection layer and the second reflection layer may destructively interfere with each other, and accordingly, the external light reflectance may be reduced.

In an embodiment of the display apparatus 1 or 1', a cover window 600 may be disposed over the display panel 10P. The cover window 600 may be a flexible window. The cover window 600 may protect the display panel 10P while being easily curved by an external force without generating a crack or the like. The cover window 600 may include glass, sapphire, or plastic. The cover window 600 may include, for example, ultra-thin glass (UTG) or colorless polyimide (CPI). In an embodiment, the cover window 600 may have a structure in which a flexible polymer layer is arranged on one surface of a glass substrate or may include only a polymer layer.

The cover window 600 may be disposed over the anti-reflection layer 500 of the display panel 10P and may be coupled to the anti-reflection layer 500 through an adhesive layer OCA such as optically clear adhesive.

In an embodiment, FIG. 5 illustrates that an embodiment where cover window 600 is disposed over the anti-reflection layer 500; however, in an alternative embodiment, the positions of the anti-reflection layer 500 and the input sensing layer 400 may be interchanged with each other, and in such an embodiment, the cover window 600 may be coupled to the input sensing layer 400 through the adhesive layer OCA.

Referring to FIG. 6, the display apparatus 1 or 1' may include a display panel 10P and a cover window 600 for protecting the display panel 10P. FIG. 6 may correspond to a cross-section of the display apparatus 1 or 1' of FIG. 1 or 2 taken along line II-II'.

In an embodiment, as described above with reference to FIGS. 1 and 2, the display apparatus 1 or 1' may include a bending area that is at least partially bent. For example, the display apparatus 1 or 1' may include a first area A1 or A1' that is a non-bending area and a second area A2 or A2' that is a bending area.

In an embodiment, a display area DA may include a main display area MDA corresponding to the first area A1 or A1' and a first bending display area BDA1 and a second bending display area BDA2 corresponding to the second area A2 or A2', and the first bending display area BDA1 and the second bending display area BDA2 may be bent with a curvature radius R1. FIG. 6 illustrates an embodiment where the first bending display area BDA1 and the second bending display area BDA2 have a same radius of curvature R1 as each other; however, in an alternative embodiment, the first bending display area BDA1 and the second bending display area BDA2 may have different radii of curvature from each other. Also, some areas of the bending area, for example, the second area A2 or A2', may correspond to a non-display area NDA.

An embodiment of the display apparatus 1 or 1' may include a display panel 10P, a cover window 600, and an adhesive layer OCA therebetween.

In an embodiment, a black matrix BM may be arranged on the rear surface of the cover window 600 to correspond to the non-display area NDA. The black matrix BM may be a colored organic layer and may be formed by a coating method. The black matrix BM may perform a light blocking function.

The adhesive layer OCA may be arranged between the display panel 10P and the cover window 600. One side (or surface) of the adhesive layer OCA may be attached to the display panel 10P and the other side may be attached to the cover window 600. In an embodiment, the adhesive layer OCA may have a same width and a same area as the display panel 10P. However, the disclosure is not limited thereto. In an alternative embodiment, the adhesive layer OCA may have a wider width than the display panel 10P. At least a portion of the adhesive layer OCA may overlap the black matrix BM arranged on the rear surface of the cover window 600.

The adhesive layer OCA may include an adhesive composition. The adhesive composition may include a monomer, a photopolymerization initiator, and an additive. The adhesive layer OCA may be in a photocurable semi-cured state. The adhesive layer OCA may be in a semi-cured state of the adhesive composition. In a manufacturing process, the adhesive layer OCA may be completely cured through ultraviolet (UV) irradiation in a final stage after an adhesive layer (OCA) attaching process and a pressing process described below.

The adhesive layer OCA may be provided to attach the cover window 600 to the display panel 10P, and the adhesive layer OCA may be desired to have high reliability, particularly in the bending area (e.g., the first bending display area BDA1 and the second bending display area BDA2). In the manufacturing process, after the adhesive layer OCA is attached to the display panel 10P and the cover window 600, a pressing process for removing bubbles from the bending area having a curvature, for example, an autoclave process, may be performed.

In a comparative example, bubbles re-penetrate into an adhesive layer from which the pressure has been removed after a pressing process, and in this regard, a display apparatus having a bending area may have vulnerable characteristics. Here, it may be understood that penetrated bubbles are visually recognized in an edge portion where a bending area is formed because gases dissolved in an adhesive layer under-high temperature/high-pressure pressing conditions (e.g., 60° C., 8 bar) are aggregated in a bubble state by failing to escape from the adhesive layer when returning to a room temperature/normal pressure (e.g., 25° C., 1 bar) after completing a pressing process.

In an embodiment of the invention, the adhesive layer OCA of the display apparatus 1 or 1' includes an adhesive composition described below, occurrence of penetrated bubbles after the pressing process may be minimized. Accordingly, by effectively preventing penetrated bubbles from occurring even after the pressing process is completed, a defect rate in the bending area may be reduced and the reliability of the display apparatus 1 or 1' may be improved.

The adhesive layer OCA according to an embodiment may be monomer and may include an adhesive composition including low-temperature glass transition (meth)acrylate, (meth)acrylate having an alicyclic group, cross-linkable (meth)acrylate, (meth)acrylate having a hydroxyl group, and/or reactive dilution monomer. In an embodiment, the adhesive composition may further include a photopolymerization initiator and an additive.

In an embodiment, the adhesive composition may include about 35 weight percent (wt %) to about 45 wt % of low-temperature glass transition (meth)acrylate, about 15 wt % to about 25 wt % of (meth)acrylate having an alicyclic group, about 15 wt % to about 25 wt % of cross-linkable (meth)acrylate, about 10 wt % to about 20 wt % of (meth) acrylate having a hydroxyl group, and about 3 wt % to about 10 wt % of reactive dilution monomer.

Herein, the content of each component included in the adhesive composition may be based on the total weight of all components of the adhesive composition and may be the result of analysis by nuclear magnetic resonance (NMR) spectroscopy. NMR spectroscopy may be a method of measuring a sample to be analyzed, by using radio frequency (RF) resonance that causes rotational transition of an atomic nucleus.

The low-temperature glass transition (meth)acrylate may include, for example, at least one selected from benzyl (meth)acrylate, n-butyl (meth)acrylate, sec-butyl (meth) acrylate, cyclohexyl (meth)acrylate, iso-decyl (meth)acrylate, n-decyl (meth)acrylate, lauryl (meth)acrylate (meth) acrylate, 2-ethylhexyl (meth)acrylate (2-EHA), 2-(2-ethoxyethoxy)ethyl acrylate, n-hexyl acrylate, and n-octyl (meth)acrylate. In an embodiment, for example, the low-temperature glass transition (meth)acrylate may be 2-ethylhexyl (meth)acrylate (2-EHA). The low-temperature glass transition (meth)acrylate may be (meth)acrylate in which a glass transition temperature of a homopolymer is about −100° C. to about 40° C., about −80° C. to about 30° C., or about −75° C. to about −20° C. The low-temperature glass transition (meth)acrylate may be included at a content of about 35 wt % to about 45 wt %, for example, about 36 wt % to about 40 wt %.

The (meth)acrylate having the alicyclic group may include, for example, at least one selected from isobornyl (meth)acrylate (IBOA), bornyl (meth)acrylate, and cyclohexyl (meth)acrylate. In an embodiment, for example, the (meth)acrylate having the alicyclic group may be isobornyl (meth)acrylate (IBOA). In an embodiment, for example, the (meth)acrylate having the alicyclic group may be (meth) acrylate in which a glass transition temperature of a homopolymer is 90° C. or greater, for example, a glass transition temperature in a range of about 90° C. to about 120° C. In an embodiment, the (meth)acrylate having the alicyclic group may be included at a content of about 15 wt % to about 25 wt %, for example, about 18 wt % to about 23 wt %. In such an embodiment where the (meth)acrylate having the alicyclic group satisfies the above condition, the effect of increasing the peeling force and modulus of the adhesive layer OCA may be obtained, and the stable folding properties of the adhesive layer OCA may be secured.

The cross-linkable (meth)acrylate may be, for example, (meth)acrylate having an alkyl group. The alkyl group of the (meth)acrylate having the alkyl group may be a linear or branched C1-C14 alkyl group and particularly may be a C1-C8 alkyl group. In an embodiment, the (meth)acrylate having the alkyl group may include one selected from methyl (meth)acrylate, ethyl (meth)acrylate, n-propyl (meth)acrylate, isopropyl (meth)acrylate, n-butyl (meth) acrylate, t-butyl (meth)acrylate, sec-butyl (meth)acrylate, pentyl (meth)acrylate, 2-ethylhexyl (meth)acrylate, 2-ethylbutyl (meth)acrylate, octyl (meth)acrylate) acrylate (OMA), isooctyl (meth) acrylate, isobornyl (meth) acrylate, isononyl (meth) acrylate, and any combination thereof. In an embodiment, for example, the cross-linkable (meth)acrylate may be octyl (meth)acrylate (OMA). The adhesive layer OCA may be adjusted to have suitable adhesive properties by using (meth)acrylate having an alkyl group having a carbon number within the above range. This cross-linkable (meth) acrylate may be included at a content of about 15 wt % to about 25 wt %, for example, about 17 wt % to about 23 wt %.

The (meth)acrylate having the hydroxyl group may be (meth)acrylate including one or more hydroxyl groups. The (meth)acrylate having the hydroxyl group include, for example, at least one selected from 2-hydroxyethyl (meth) acrylate (2-HEA), 2-hydroxypropyl (meth)acrylate, 3-hydroxypropyl (meth)acrylate, 2-Hydroxybutyl (meth)acrylate, 4-hydroxybutyl (meth)acrylate, 6-hydroxyhexyl (meth) acrylate, 1,4-cyclohexanedimethanol mono (meth)acrylate, 1-chloro-2-hydroxypropyl (meth)acrylate, diethylene glycol mono(meth)acrylate, 1,6-hexanediol mono(meth)acrylate, pentaerythritol tri(meth)acrylate, dipentaerythritol penta(meth)acrylate, neopentyl glycol mono(meth)acrylate, trimethylolpropane di(meth)acrylate, trimethylolethane di(meth) acrylate, 2-hydroxy-3-phenyloxypropyl(meth)acrylate, 4-hydroxycyclopentyl (meth) acrylate, 4-hydroxycyclohexyl (meth) acrylate, and cyclohexanedimethanol mono (meth) acrylate. In an embodiment, for example, the (meth) acrylate having the hydroxyl group may be 2-hydroxyethyl (meth)acrylate (2-HEA). The (meth)acrylate having the hydroxyl group may provide the adhesive force of the adhesive layer OCA. The (meth)acrylate having the hydroxyl group may be included at a content of about 10 wt % to about 20 wt %, for example, about 14 wt % to about 18 wt %. In such an embodiment where the (meth)acrylate having the hydroxyl group satisfies the above condition, the adhesive force and durability reliability of the adhesive layer OCA may be improved, and the shear strength ratio thereof may be secured.

The reactive dilution monomer may be monomer having a reactive functional group such as a (meth)acryloyl group in a molecular structure thereof. In an embodiment, for example, the reactive dilution monomer may be alkyl (meth) acrylate; hydroxy group-containing monomer such as hydroxyethyl (meth)acrylate, hydroxypropyl (meth)acrylate, or hydroxybutyl (meth)acrylate; carboxyl group-containing monomer such as (meth)acrylic acid or beta-carboxyethyl (meth)acrylate; alkoxy group-containing monomer such as 2-(2-ethoxyethoxy)ethyl (meth)acrylate; aromatic group-containing monomer such as benzyl (meth) acrylate or phenoxyethyl (meth)acrylate; heterocyclic moiety-containing monomer such as tetrahydrofurfuryl (meth) acrylate or (meth)acryloyl morpholine; or multifunctional acrylate. In an embodiment, for example, the reactive dilution monomer may be (meth)acrylic acid. In the adhesive composition, the reactive dilution monomer may be included at a content of about 3 wt % to about 10 wt %, for example, about 4 wt % to about 8 wt %. The reactive dilution monomer may control physical properties such as viscosity and elasticity of the adhesive layer OCA and implement the adhesive force after curing. In such an embodiment where the reactive dilution monomer satisfies the above condition, the physical properties and adhesive force of the adhesive layer OCA may be improved such that the penetrated bubbles of the adhesive layer OCA are reduced.

The photopolymerization initiator may include, for example, 2-hydroxy-2-methyl-1-phenyl-propan-1-one (Irgacure 1173 from Ciba Geigy). In an embodiment, in the adhesive composition, the photopolymerization initiator may be included at a content of about 0.1 wt % to about 0.4 wt %.

The additive may include, for example, 3-glycidoxypropyl trimethoxysilane (silane A 187). In an embodiment, in the adhesive composition, the additive may be included at a content of about 0.5 wt % or less. The additive may control the cross-linkage of the adhesive layer OCA and improve the adhesion thereof.

FIG. 7 is a table showing the comparison between components of adhesive compositions according to an embodiment and a comparative example, and FIG. 8 is a table showing the comparison between particular component ratios of adhesive compositions according to an embodiment and a comparative example. FIG. 9 is a table illustrating the penetrated bubble analysis test results of adhesive layers including adhesive compositions according to an embodiment and a comparative example of the disclosure.

Referring to FIG. 7, the adhesive composition according to an embodiment may include, for example, the following materials.

Embodiment

The adhesive composition according to an embodiment may include 2-ethylhexyl (meth)acrylate (2-EHA), isobornyl (meth)acrylate (IBOA), octyl (meth)acrylate (OMA), 2-hydroxyethyl (meth)acrylate (2-HEA), and (meth)acrylic acid as a monomer, 2-hydroxy-2-methyl-1-phenyl-propan-1-one (Irgacure 1173) as a photopolymerization initiator, and 3-glycidoxypropyltrimethoxysilane (silane A 187) as an additive.

Comparative Example

The adhesive composition according to a comparative example may include 2-ethylhexyl (meth)acrylate (2-EHA), isobornyl (meth)acrylate (IBOA), and octyl (meth)acrylate (OMA) as a monomer, 2-hydroxy-2-methyl-1-phenyl-propan-1-one (Irgacure 1173) as a photopolymerization initiator, and 3-glycidoxypropyltrimethoxysilane (silane A 187) as an additive.

Unlike the comparative example, the adhesive composition according to an embodiment may include 2-hydroxyethyl (meth)acrylate (2-HEA) and (meth)acrylic acid and may include a 5-component monomer.

Also, referring to FIG. 8, the adhesive composition according to an embodiment may include 2-ethylhexyl (meth) acrylate (2-EHA), isobornyl (meth) acrylate (IBOA), octyl (meth)acrylate (OMA), 2-hydroxy-2-methyl-1-phenyl-propan-1-one (Irgacure 1173), and 3-glycidoxypropyltrimethoxysilane (silane A 187) like the adhesive composition of the comparative example but may have a different component ratio than the adhesive composition of the comparative example.

For example, the embodiment of FIG. 8 may include 36.4 wt % 2-ethylhexyl (meth) acrylate (2-EHA), 21.2 wt % isobornyl (meth) acrylate (IBOA), 19.0 wt % octyl (meth) acrylate (OMA), 16.1 wt % 2-hydroxyethyl (meth)acrylate (2-HEA), 5.2 wt % (meth)acrylic acid, 0.1 wt % 2-hydroxy-2-methyl-1-phenyl-propane-1-one (Irgacure 1173), and 2.0 wt % 3-glycidoxypropyltrimethoxysilane (silane A 187).

The comparative example may include 46.45 wt % 2-ethylhexyl (meth) acrylate (2-EHA), 13.65 wt % isobornyl (meth) acrylate (IBOA), 37.80 wt % octyl (meth) acrylate (OMA), 0.1 wt % 2-hydroxy-2-methyl-1-phenyl-propan-1-one (Irgacure 1173), and 2.0 wt % 3-glycidoxypropyltrimethoxysilane (silane A 187).

As shown in the table of FIG. 9, it may be seen that this result causes a penetrated bubble difference between the embodiment and the comparative example. Penetrated bubbles may refer to bubbles generated in the adhesive layer after the adhesive layer is attached in the manufacturing process and may be generated in the adhesive layer itself due to a decrease in the temperature and pressure in the adhesive layer or may be generated due to the penetration of external air thereinto. For example, as described above, the display panel 10P and the cover window 600 is attached to each other by using the adhesive layer and then a high-temperature (e.g., 60° C.) pressing process, that is, an autoclave process, is performed; however, penetrated bubbles may be generated in the adhesive layer from which the pressure has been removed after the pressing process and may act as a defective factor of the display apparatus.

The adhesive composition samples of the embodiment and the comparative example were pressed at a high temperature in the same way as the autoclave process conditions (60° C., 8 bar), and then the pressure was removed therefrom, and then penetrated bubbles generated in each sample were checked.

Referring to FIG. 9, in the comparative example, penetrated bubbles were generated in 3 samples among 30 test samples. In the comparative example, the size of the penetrated bubble was 110 micrometers (μm) and the penetration distance thereof was 310 μm. The size and distance of the penetrated bubble observed in the comparative example may be visible to the user or may act as a moisture permeation path even when not visually recognized, thus degrading the overall reliability of the display apparatus. An image of the comparative example shows that circular penetrated bubbles were generated after the autoclave process. On the other hand, in the embodiment, it may be seen that no penetrated bubbles were generated in 30 test samples.

Thus, it may be experimentally seen that, because the adhesive composition according to an embodiment further includes 2-hydroxyethyl (meth)acrylate (2-HEA) and (meth) acrylic acid as a monomer and particularly includes about 10 wt % to about 20 wt % of 2-hydroxyethyl (meth)acrylate (2-HEA) and about 3 wt % to about 10 wt % of (meth)acrylic acid, the penetrated bubbles of the adhesive layer OCA may be reduced. Accordingly, the display apparatus including the adhesive composition according to an embodiment may have a reduced defect rate and improved reliability.

Figure 10:
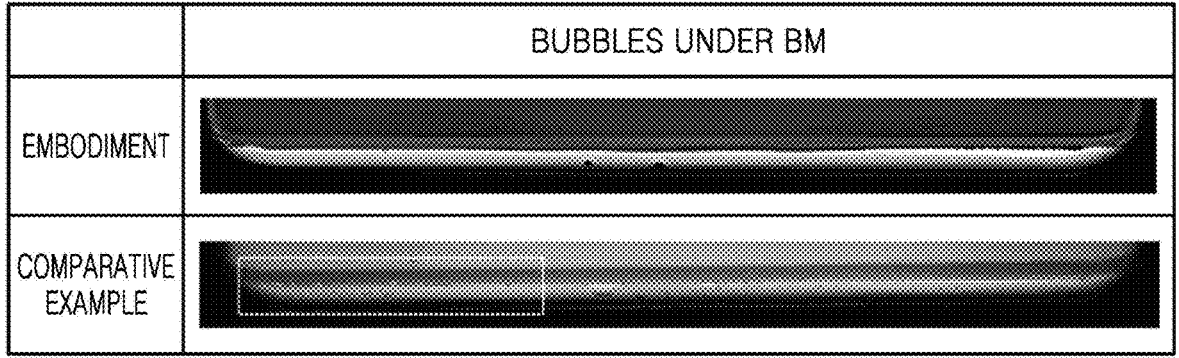
FIG. 10 is a table illustrating the reliability evaluation results of adhesive layers including adhesive compositions according to an embodiment and a comparative example.

FIG. 10 is a table illustrating the reliability evaluation results of adhesive layers including adhesive compositions according to an embodiment and a comparative example. In a high-temperature and high-humidity environment, the occurrence of bubbles in the adhesive layer under the black matrix BM (see FIG. 6) was evaluated. Particularly, the adhesive layers OCA including the adhesive compositions of the embodiment and the comparative example were attached to the cover window 600 (see FIG. 5) and then put in a chamber with a temperature of 85° C. and a humidity of 85%, and then the occurrence of bubbles under the black matrix BM was observed after a lapse of 500 hours.

Here, the bubbles under the black matrix BM may be understood as bubbles that are originated from the inside of the adhesive layer OCA in the adhesive layer OCA under the black matrix BM or are generated due to the inflow of external air. The adhesive layer OCA under the black matrix BM corresponding to the non-display area NDA may be vulnerable to exposure due to the black matrix BM. Because the amount of light reaching a portion of the adhesive layer OCA disposed thereunder is small due to the black matrix BM, curing of the portion thereof may be relatively insufficient, thus degrading the durability thereof. Accordingly, bubbles may be generated in the portion of the adhesive layer OCA.

Referring to FIG. 10, in the comparative example, a plurality of bubbles were generated under the black matrix BM. As shown in FIG. 10, in the embodiment, it may be seen that bubbles under the black matrix BM are hardly observed. Thus, it may be seen that the occurrence of bubbles in the adhesive layer including the adhesive composition according to an embodiment under the black matrix BM is reduced. Accordingly, the reliability of the display apparatus including the adhesive composition according to an embodiment may be improved.

FIG. 11 is a table showing the measurements of physical properties of adhesive layers including adhesive compositions according to an embodiment and a comparative example. Particularly, FIG. 11 illustrates the measured values of an elastic modulus (G'), a maximum stress at a temperature of 70° C., and a gel fraction (gelation rate) with respect to the adhesive layers obtained by 65% curing of the adhesive compositions of the embodiment and the comparative example. These physical properties were measured by using a rheometer (Discovery HR30 from TA).

In an embodiment, the adhesive layer according to the disclosure may have an elastic modulus of about 50 kilopascals (KPa) or greater, for example, about 70 KPa or greater, or about 80 KPa or greater, at a temperature of 60° C. In an embodiment, a maximum value of time-varying stress (hereinafter, referred to as "maximum stress") of the adhesive layer according to the disclosure may be about 10,000 Pa or less, for example, about 7,000 Pa or greater and about 9,500 Pa or less, that is, in a range of about 7,000 Pa to about 9,500 Pa, when a strain of 25% is applied thereto at a temperature of 70° C. In an embodiment, the gel fraction of the adhesive layer according to the disclosure may be about 55% or greater, for example, about 65% or greater. In this case, the adhesive layer may be a cured product of the adhesive composition and may be obtained by curing the adhesive composition by about 60% to about 70%. In an embodiment, for example, the adhesive layer may include a 65% cured product of the adhesive composition.

The elastic moduli of the embodiment and the comparative example of FIG. 11 were measured at a temperature of 25° C. and then measured at an increased temperature of 60° C. In this case, the temperature of 25° C. may correspond to the room temperature. The maximum stress may represent the maximum value among the resulting stress values when the same strain is applied to the sample. When a strain of 25% using a shear stress was applied to the samples of the embodiment and the comparative example at the temperature of 70° C. by using a rheometer, the maximum value of a stress required to maintain a constant strain was measured. According to a stress relaxation phenomenon, when a strain is instantaneously applied to the sample, the stress to maintain a constant strain may be highest at the moment when the strain is applied thereto (e.g., about 1 second) and may decrease gradually over time. The maximum stress may be measured at the moment when the strain is applied thereto, that is, about the first 1 second.

Referring to FIG. 11, in the case of the elastic modulus, in the comparative example, the elastic modulus at a temperature of 25° C. was measured as 160 KPa, and the elastic modulus at the temperature of 60° C. was measured as 87 KPa. On the other hand, in the embodiment, the elastic modulus at the temperature of 25° C. was measured as 170 KPa, and the elastic modulus at the temperature of 60° C. was measured as 46 KPa. As for a general organic polymer, when the temperature thereof increases from low temperature to high temperature, the physical properties thereof may become flexible and thus the elastic modulus thereof may decrease. Unlike the comparative example, the elastic modulus of the embodiment at a high temperature (60° C.) was measured as 50 KPa or greater. Compared to the comparative example, in the embodiment, it may be seen that the degree of reduction of the elastic modulus at a high temperature (60° C.) is small.

In the case of the maximum stress, in the comparative example, the maximum stress was measured as 14,138 Pa when a strain of 25% was applied thereto at the temperature of 70° C., whereas in the embodiment, the maximum stress was measured as 8,650 Pa when a strain of 25% was applied thereto at 70° C. In the embodiment, it may be seen that the maximum stress is about 10,000 Pa or less when a 25% strain is applied thereto at a high temperature (70° C.).

Also, in the case of the gel fraction, the gel fraction of the comparative example was measured as 52%, whereas the gel fraction of the embodiment was measured as 72%. Compared to the comparative example, it may be seen that the gel fraction of the embodiment is improved.

The adhesive composition according to embodiments of the disclosure may include 2-hydroxyethyl (meth)acrylate (2-HEA) and (meth)acrylic acid as a monomer. Particularly, the adhesive composition according to an embodiment may include about 35 wt % to about 45 wt % of 2-ethylhexyl (meth)acrylate (2-EHA) and about 15 wt % to about 25 wt % of isobornyl (meth)acrylate (IBOA), about 15 wt % to about 25 wt % of octyl (meth)acrylate (OMA), about 10 wt % to about 20 wt % of 2-hydroxyethyl (meth)acrylate (2-HEA), about 3 wt % to about 10 wt % (meth)acrylic acid, 2-hydroxy-2-methyl-1-phenyl-propan-1-one (Irgacure 1173), and 3-glycidoxypropyltrimethoxysilane (silane A 187). The adhesive composition according to embodiments of the disclosure having the above component and composition ratio may have physical properties capable of reducing penetrated bubbles. In an embodiment of the adhesive layer including the adhesive composition, the elastic modulus may be about 50 KPa or greater at a temperature of 60° C., the maximum value of time-varying stress (i.e., maximum stress) may be about 10,000 Pa or less when a strain of 25% is applied thereto at a temperature of 70° C., and the gel fraction may be about 55% or greater. Thus, in the adhesive layer according to embodiments of the disclosure, penetrated bubbles may be reduced, and accordingly, the reliability of the display apparatus may be improved.

According to an embodiment, an adhesive composition with improved reliability against penetrated bubbles at an edge portion of a display apparatus and a display apparatus including the adhesive composition may be implemented.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. An adhesive composition comprising:
(meth)acrylate having a glass transition temperature of 40° C. or less;
(meth)acrylate having an alicyclic group;
cross-linkable (meth)acrylate;
(meth)acrylate having a hydroxyl group; and
reactive dilution monomer,
wherein a cured product of the adhesive composition has an elastic modulus of about 50,000 Pa or greater at a temperature of 60° C.,
wherein the (meth)acrylate having the hydroxyl group is included at a content of 10 wt % to 20 wt %, and
wherein the reactive dilution monomer is included at a content of about 3 wt % to about 10 wt %.

2. The adhesive composition of claim 1, wherein the (meth)acrylate having the glass transition temperature of 40° C. or less is included at a content of about 35 wt % to about 45 wt %.

3. The adhesive composition of claim 1, wherein the (meth)acrylate having the alicyclic group is included at a content of about 15 wt % to about 25 wt %.

4. The adhesive composition of claim 1, wherein the cross-linkable (meth)acrylate is included at a content of about 15 wt % to about 25 wt %.

5. The adhesive composition of claim 1, wherein the (meth)acrylate having the hydroxyl group comprises 2-hydroxyethyl (meth)acrylate.

6. The adhesive composition of claim 1, wherein the reactive dilution monomer comprises (meth)acrylic acid.

7. The adhesive composition of claim 1, wherein
the adhesive composition further comprises a photopolymerization initiator, and
the photopolymerization initiator comprises 2-hydroxy-2-methyl-1-phenyl-propan-1-one.

8. The adhesive composition of claim 1, wherein a maximum value of time-varying stress of the cured product of the adhesive composition is about 10,000 Pa or less when a strain of 25% is applied thereto at a temperature of 70° C.

9. A display apparatus comprising:
a display panel;
a cover window disposed over the display panel; and
an adhesive layer disposed between the display panel and the cover window,
wherein the adhesive layer comprises a cured product of an adhesive composition comprising:
(meth)acrylate having a glass transition temperature of 40° C. or less;
(meth)acrylate having an alicyclic group;
cross-linkable (meth)acrylate;
(meth)acrylate having a hydroxyl group; and
reactive dilution monomer,
wherein the adhesive layer has an elastic modulus of about 50,000 Pa or greater at a temperature of 60° C.,
wherein the (meth)acrylate having the hydroxyl group is included at a content of 10 wt % to 20 wt %, and
wherein the reactive dilution monomer is included at a content of about 3 wt % to about 10 wt %.

10. The display apparatus of claim 9, wherein
the display apparatus includes a bending area which is at least partially bent, and
the display panel and the cover window corresponding to the bending area are bent.

11. The display apparatus of claim 9, wherein the (meth)acrylate having the glass transition temperature of 40° C. or less is included at a content of about 35 wt % to about 45 wt %.

12. The display apparatus of claim 9, wherein the (meth)acrylate having the alicyclic group is included at a content of about 15 wt % to about 25 wt %.

13. The display apparatus of claim 9, wherein the cross-linkable (meth)acrylate is included at a content of about 15 wt % to about 25 wt %.

14. The display apparatus of claim 9, wherein the (meth) acrylate having the hydroxyl group comprises 2-hydroxy-ethyl (meth)acrylate.

15. The display apparatus of claim 9, wherein the adhesive composition further comprises a photopoly-merization initiator, and the photopolymerization initiator comprises 2-hydroxy-2-methyl-1-phenyl-propan-1-one.

16. The display apparatus of claim 9, wherein a maximum value of time-varying stress of the adhesive layer is about 10,000 Pa or less when a strain of 25% is applied thereto at a temperature of 70° C.

* * * * *